(12) United States Patent
Katsuyama

(10) Patent No.: US 7,196,909 B2
(45) Date of Patent: Mar. 27, 2007

(54) AC COUPLING CIRCUIT HAVING A LARGE CAPACITANCE AND A GOOD FREQUENCY RESPONSE

(75) Inventor: Tomokazu Katsuyama, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 183 days.

(21) Appl. No.: 10/771,166

(22) Filed: Feb. 4, 2004

(65) Prior Publication Data
US 2004/0223306 A1    Nov. 11, 2004

(30) Foreign Application Priority Data
Feb. 4, 2003    (JP)    ............... 2003-027498

(51) Int. Cl.
H05K 7/02    (2006.01)
H05K 7/06    (2006.01)
H05K 7/08    (2006.01)
H05K 7/10    (2006.01)

(52) U.S. Cl. .................. 361/782; 361/760; 361/763; 361/306.3

(58) Field of Classification Search ........ 361/760–765, 361/782–783, 306.3; 257/777–780; 385/14
See application file for complete search history.

(56) References Cited

U.S. PATENT DOCUMENTS 5,103,283 A * 4/1992 Hite ..................... 257/724
5,767,573 A * 6/1998 Noda et al. .............. 257/675
5,945,728 A * 8/1999 Dobkin et al. ............ 257/666
6,166,937 A * 12/2000 Yamamura et al. ........ 363/141
6,313,520 B1 * 11/2001 Yoshida et al. ........... 257/676
6,661,554 B2 * 12/2003 Biran ...................... 359/239
6,791,159 B2 * 9/2004 Moto et al. .............. 257/531

FOREIGN PATENT DOCUMENTS

| JP | 62-71301 | 4/1987 |
|----|----------|--------|
| JP | 2-159753 | 6/1990 |
| JP | 4-46402 | 2/1992 |
| JP | 4-96503 | 3/1992 |
| JP | 05-235602 | 9/1993 |
| JP | 08-051179 | 2/1996 |
| JP | 11-088016 | 3/1999 |
| JP | 11-346101 | 12/1999 |

OTHER PUBLICATIONS

Japanese Office Action issued in corresponding Japanese Patent Application No. JP 2003-027498, dated Oct. 31, 2006.

* cited by examiner

*Primary Examiner*—Tuan Dinh
(74) *Attorney, Agent, or Firm*—McDermott Will & Emery LLP (57) ABSTRACT

This invention is directed to reduce degradation, loss, and reflection of high frequency signals of a coupling circuit for an alternating current. The coupling circuit, for connecting a first circuit element to a second circuit element, comprises a die capacitor and a chip capacitor connected in parallel to each other. The die capacitor has a first electrode that faces to and is in contact with the first circuit element, and a second electrode that is wire-bonded to the second circuit element. The chip capacitor also has a first electrode that is in contact with the first circuit element and a second electrode that is in contact with the second electrode of the die capacitor. The coupling circuit may show both advantages of superior performance at high frequencies attributed to the die-capacitor and relative large capacitance attributed to the chip-capacitor.

6 Claims, 9 Drawing Sheets

FIG. 1

Prior Art

AC COUPLING CIRCUIT HAVING A LARGE CAPACITANCE AND A GOOD FREQUENCY RESPONSE

BACKGROUND OF THE INVENTION

1. Field of the Invention

The present relates to an alternating current (AC) circuit, especially, relates to an AC circuit in which a capacitor is used for electrically connecting circuit elements.

2. Related Prior Art

An AC circuit operating in a high frequency band uses specific circuit elements such as transmission line types of a micro-strip and a co-planar, and a passive element with a chip shape. In order to electrically connect active elements, such as an amplifier, the AC coupling circuit must be set between them because direct current (DC) levels of these active elements are different to each other. For example, in the case that two amplifier are serially connected, the output DC level of the precedent amplifier often mismatches to the input DC level of the succeeding one. The AC coupling circuit generally includes a coupling capacitor set on the transmission line connecting the preceding circuit to the succeeding one.

Figure 1:
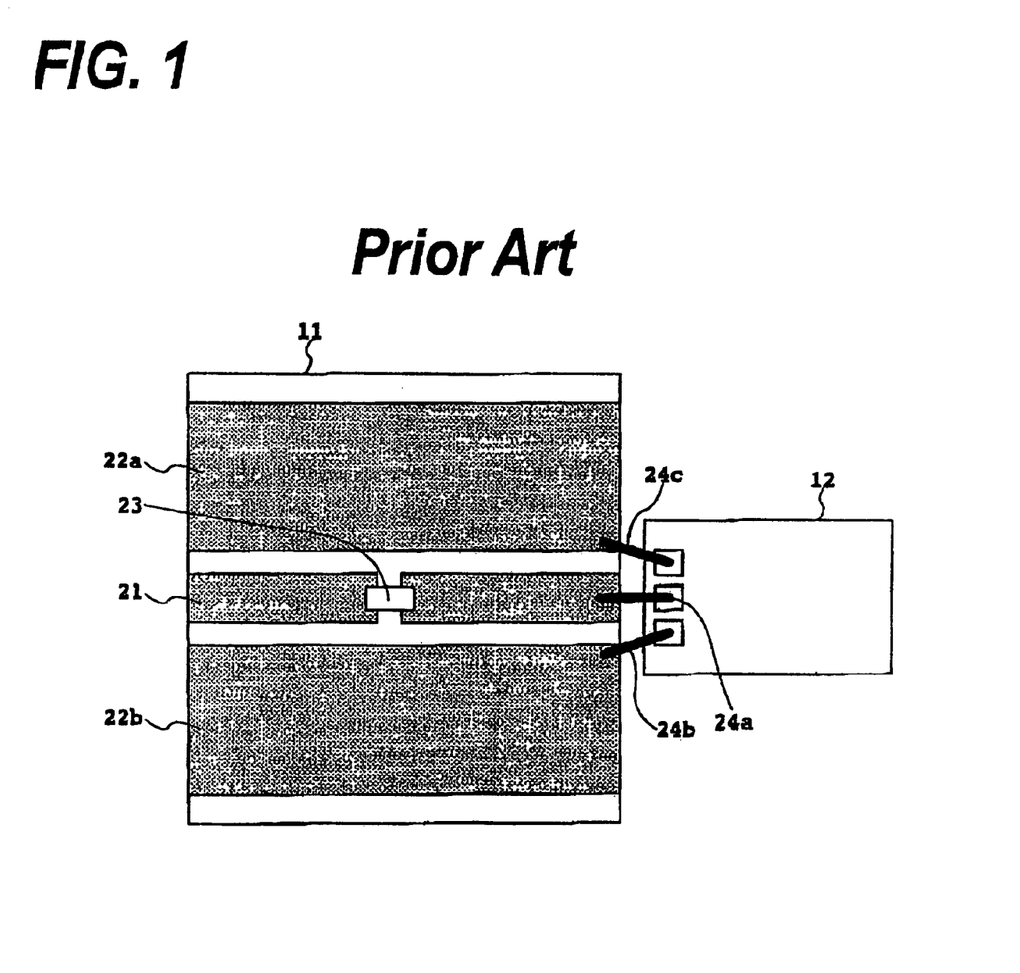
FIG. 1 shows a conventional arrangement of a coupling capacitor.

FIG. 1 shows a conventional arrangement of the coupling capacitor. In FIG. 1, an integrated circuit 11 with a bare chip shape is connected, by a plural bonding wires 24a to 24c, to a wiring substrate 11 on which two ground patterns 22a and 22b sandwich a transmission line 21 therebetween. The transmission line 21 is split and the capacitor 23 is mounted on the line 21 so as to connect the split line.

In such AC coupling circuit shown in FIG. 1, even in the case that the transmission line 21 and the ground patterns adjacent thereto is so designed to adjust the transmission impedance, an impedance mismatching may occur at points the coupling capacitor is connected to the transmission line. This causes a reflection, loss and deterioration of the signal transmitted thereon.

Further, a gap between the substrate 11 and the IC 12 must be secured at least 200 µm, which causes bonding wires 24a to 24c longer than 400 µm or amount to 500 µm. Such long and slim bonding wire behaves as an inductor. For example, a ribbon wire with a 50 µm in width and a 20 µm in thickness has a parasitic inductance of about 200 pH. The parasitic inductance inherently accompanied with the bonding wire degrades quality of high frequency signals by the resonance with input capacitance of the IC 12.

SUMMARY OF THE INVENTION

One aspect of the present invention is to provide a coupling circuit that keeps the quality of the transmitted high frequency signal, and reduces a loss and a reflection of the signal.

According to one aspect of the present invention, a coupling circuit, for connecting a first circuit element to a second circuit element comprises a die capacitor and a chip capacitor. The die capacitor has a first electrode that faces to and is in contact with the first circuit element, and a second electrode that is wire-bonded to the second circuit element. The chip capacitor also has a first electrode that is in contact with the first circuit element and a second electrode that is in contact with the second electrode of the die capacitor.

Since the die capacitor and the chip capacitor, thus arranged, are connected in parallel, the coupling circuit may show each advantage. Namely, the die capacitor has a parallel-plate-like structure with superior performance at high frequencies. On the other hand, the chip capacitor has comb-shaped electrodes that enables to widen an area of the electrode and to bring electrodes close to each other, thereby increasing the capacitance of the chip capacitor.

In the present invention, one of circuit elements may be a co-planar line and the other of circuit elements may be a co-planar line or an integrated circuit.

DETAILED DESCRIPTION OF PREFERRED EMBODIMENT

Next, preferred embodiments of the present invention will be described as referring to accompanying drawings.

Figures 2A, 2B:
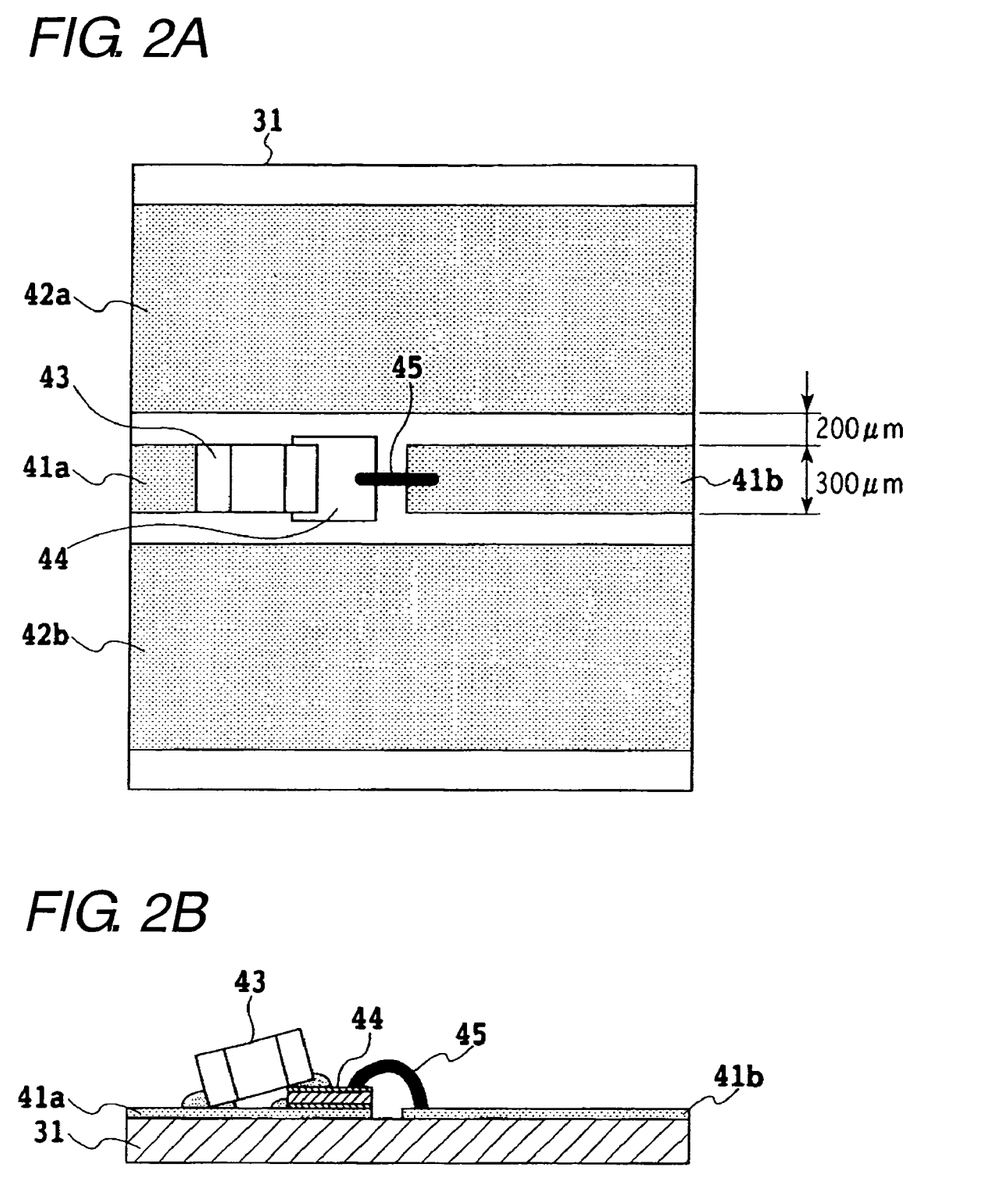
FIG. 2A is a plan view showing an arrangement of coupling capacitors according to the first embodiment of the present invention.
FIG. 2B is a side view of the arrangement of the first embodiment.

FIG. 2 shows an arrangement of a coupling capacitor according to the present invention. FIG. 2A is a plan view of a substrate made of ceramics that is encased in a metal package, and FIG. 2B is a side view. The ceramic substrate 31 provides a coplanar line thereon, which includes a signal line 41 and a pair of ground patters 42a and 42b sandwiching the signal line 41. The signal line 41 is split into two portions 41a and 41b. On an edge of the signal line 41a, a die capacitor 44 is mounted such that a one surface of the die capacitor 44 faces to the signal line 41a. Another surface of the die capacitor 44 is electrically connected to an edge of anther signal line 41b with a bonding wire made of gold (Au). Further, a chip capacitor 43 is connected between another surface of the die capacitor 44 and the signal line 41a such that the one electrode of the chip-capacitor 43 is directly soldered to another surface of the die capacitor. Thus, the signal line split into two lines and two capacitors, one is the die capacitor 44 and the other is the chip capacitor 43 constitutes the coupling circuit.

As shown in FIG. 2, the die capacitor 44 is a capacitor having a parallel-plate type of electrodes sandwiching a dielectric material therebetween. An upper surface corresponds to one electrode while the bottom surface thereof is another electrode. Generally, the capacitance of the die capacitor is small relative to that of the chip capacitor. The die capacitor is directly mounted on the signal line 31 such that the bottom surface thereof is in contact with the signal line 41a. On the other hand, the upper electrode is wire-bonded to anther signal line 41b.

The chip capacitor 43 is a capacitor having comb-like electrodes. Between teethes of one electrodes is inter-digitally inserted teethes of another electrodes, thereby widening the equivalent area of the electrodes. The chip capacitor shows a greater capacitance relative to the die capacitor. However, due to its comb-like structure, the chip capacitor shows an inferior high frequency performance to the die capacitor. Namely, the chip capacitor has a greater parasitic inductance than the die capacitor.

Figure 3:
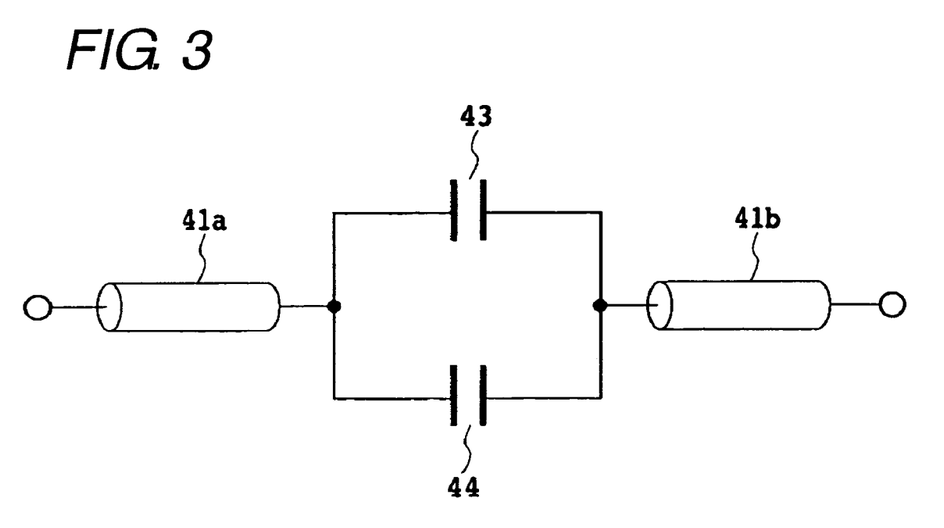
FIG. 3 is an equivalent circuit diagram of the first embodiment.

FIG. 3 is an equivalent circuit diagram of the coupling circuit. A chip capacitor 43 having a greater capacitance and a die capacitor 44 having relatively smaller capacitance are connected in parallel to the split signal line 41a and 41b. The chip capacitor 43 exhibits a desired performance at relatively low frequencies, while the die capacitor 44 exhibits a performance at high frequencies. Therefore, by inserting two capacitors each connected in parallel and showing different performance, the coupling circuit applicable to wide frequency range may be obtained.

Figure 4A:
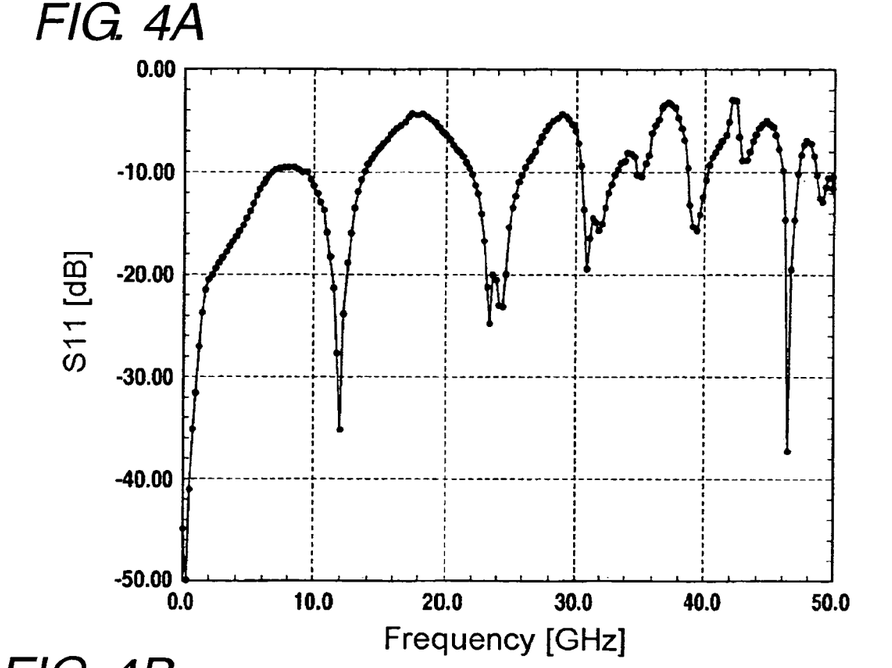
FIG. 4 is a reflection spectrum of a conventional coupling circuit.
Figure 4B:
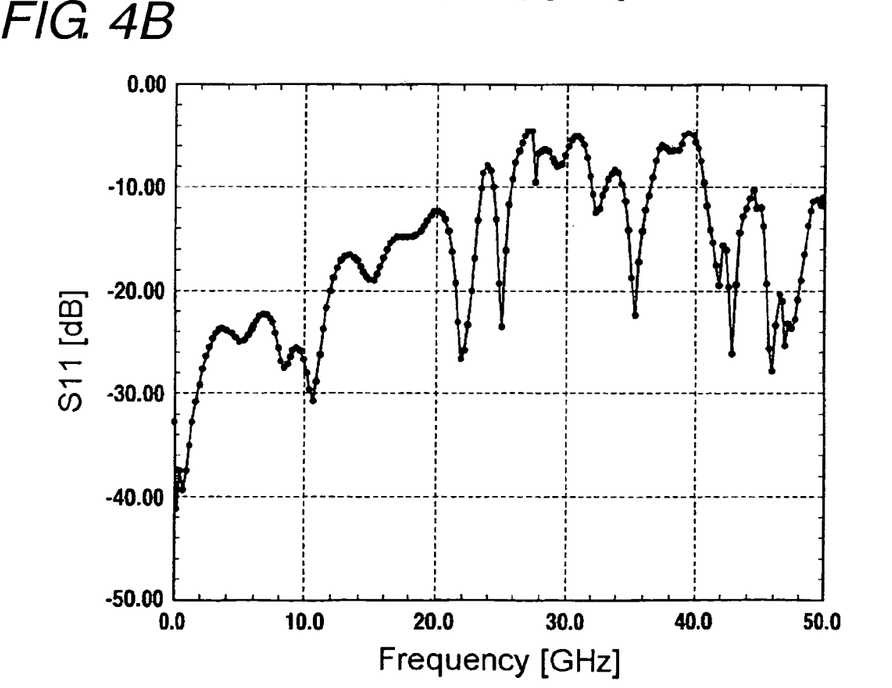
FIG. 4B is a reflection spectrum of the present coupling circuit.

The co-planar line 41 preferably has the same width as that of the chip capacitor 43. When the width of both elements are same, an impedance mismatching at the connecting point between the co-planar line 41 and the chip capacitor 43 may be reduced. One example of such arrangement is that, in FIG. 2, the chip capacitor is a 0603 type having 600 μm in length and 300 μm in width, the width of the co-planar line 41 is 300 μm, and gaps between the co-planar line 41 and adjacent ground patterns 42 is 200 μm, The dimension of the die capacitor 44 is 380 μm square. When the size of the die capacitor 44 is equal to the width of the co-planar line 41, the impedance mismatching may be further reduced, FIG. 4 is reflection characteristics of coupling circuit. The reflection characteristic is evaluated by the parameter of S11. Namely, Closer the value of the S11 to 0 dB, the greater the reflection, which the signal transmitted in the co-planar line is influenced by the impedance mismatching. FIG. 4A corresponds to the conventional coupling circuit, while FIG. 4B reflects the present circuit. In the present coupling circuit shown in FIG. 4B, the frequency responses can be improved below 30 GHz.

Figure 5A:
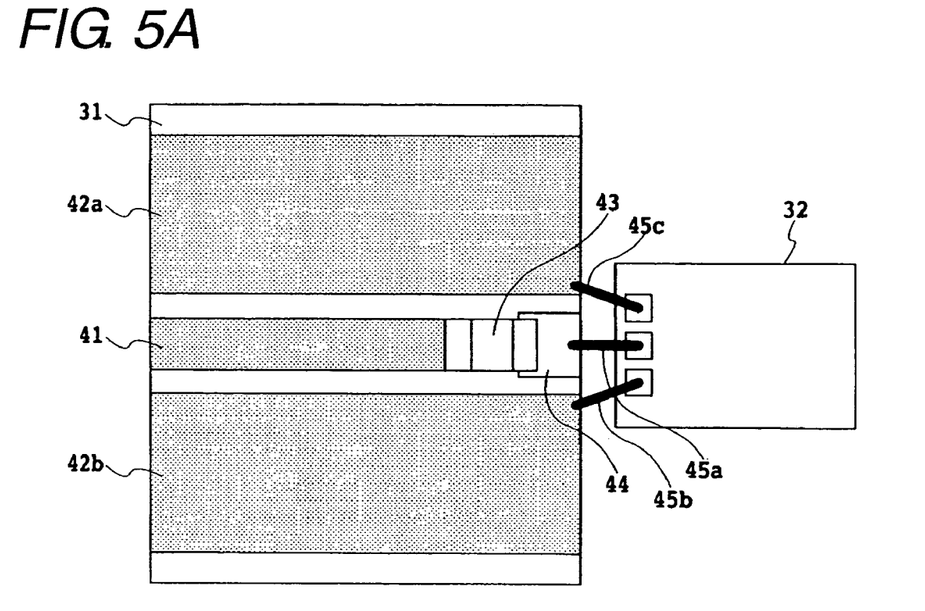
FIG. 5A is a plan view showing the second embodiment of the present invention.
Figure 5B:
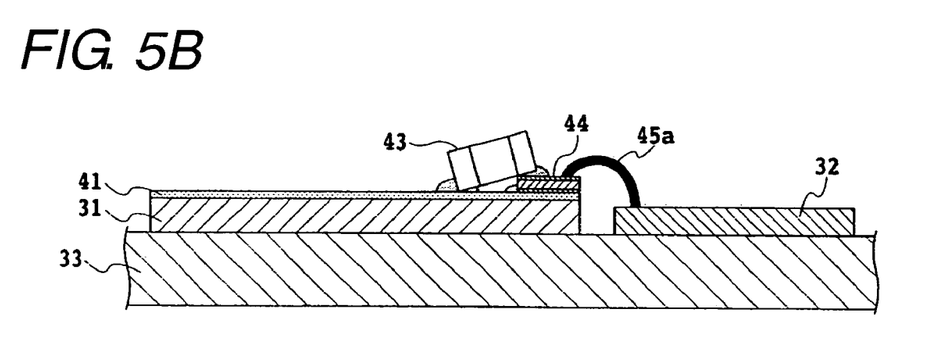
FIG. 5B is a side view of the second embodiment.

FIG. 5 is a second coupling circuit according to the present invention. FIG. 5A is a plan view showing a ceramic substrate 31 enclosed in a metal package 33 and an IC chip 32 in a bare chip shape. FIG. 5B is a side view of the second coupling circuit. On the ceramic substrate 31, a co-planar line 41 with predetermined gaps between adjacent ground patterns 42a and 42b is provided. At an edge of the co-planar line 41, one electrode of the die capacitor 44 is connected, while the other electrode of the die capacitor is wire-bonded to the bare chip IC 32 with a gold wire 45a.

Between the co-planar line 41 and the other terminal of the die capacitor 44, a chip capacitor is arranged, thus two capacitors constitute the coupling circuit. In a coupling circuit that connects the IC to the co-planar line, a point between the co-planar line and the capacitors and another point between the one electrode of the die capacitor 44 and the bonding wire may cause an impedance mismatching. Therefore, the IC 32 in FIG. 5 is directly bonded to upper electrode of the die capacitor 44, which reduces the points where the impedance mismatching may occur.

Figure 6A:
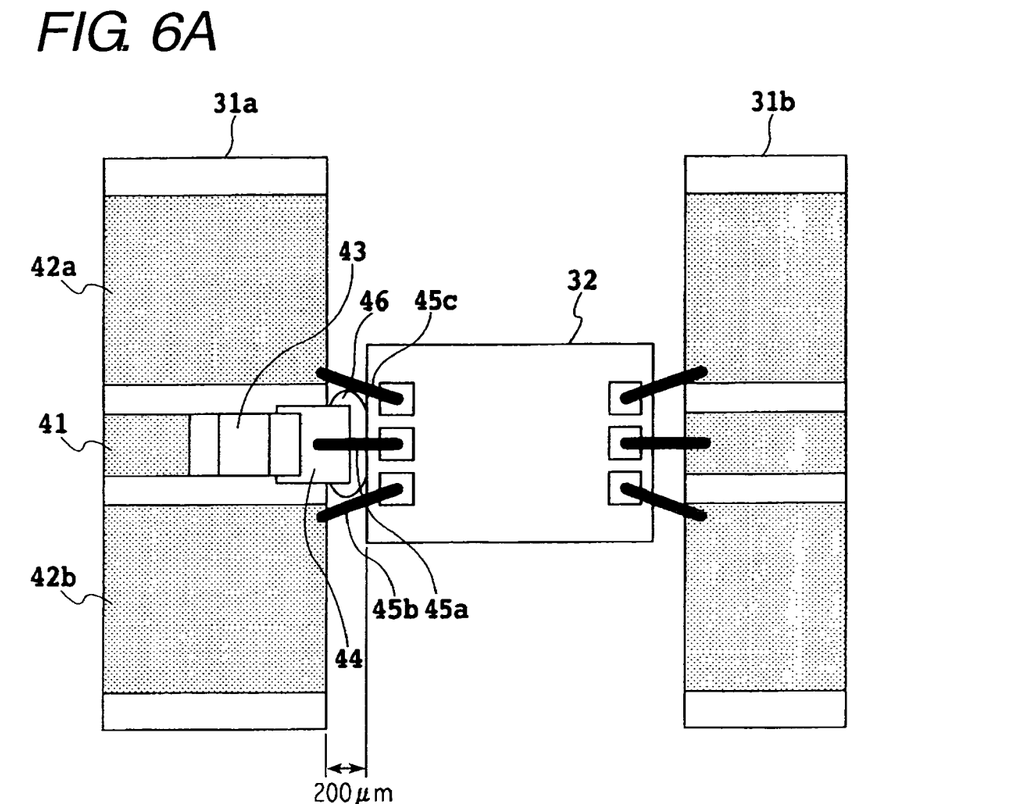
FIG. 6A is a plan view showing the third embodiment of the present invention and FIG. 6B is a side view of the third embodiment.
Figure 6B:
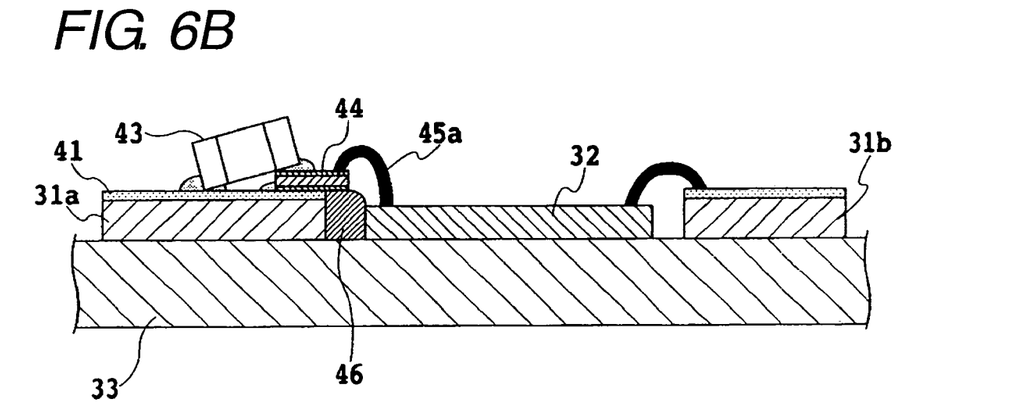

FIG. 6 is still another embodiment of the present invention. FIG. 6A shows two ceramic substrates 31a and 31b both enclosed in a metal package 33, and an IC in the bare chip shape. In FIG. 6A, only the bottom of the metal package 33 is appeared. On the ceramic substrate 31a, a co-planar line 41 is provided. The co-planar line 41 is formed such that gaps in both side thereof between respective ground patterns 42a and 42b are formed. At an edge of the co-planar line 41, one electrode of the die capacitor 44 is connected, while the upper electrode thereof is connected to the bare chip IC with a bonding wire 45a. The chip capacitor 43 is assembled such that one electrode thereof is directly facing to the co-planar line 41, and the other electrode is directly connected to the upper electrode of the die capacitor 44, thus constituting the coupling circuit.

The die capacitor 44 is assembled on the co-planar line 41 such that the edge of the die capacitor 44 is sticking out from the edge of the co-planar line 41 toward the bare chip IC 32. The gap between the IC 32 and the co-planar line is typically 200 μm due to the assembly of the IC 32. However, the present embodiment enables to narrow the gaps therebetween, thereby shortening the bonding wire 45a. Thus, the arrangement of the present embodiment can reduce the parasitic inductance of the bonding wire 45a, the deterioration and the loss of the signal at high frequencies.

Between the ceramic substrate 31a and the bare chip IC 32, an insulated resin 46 is preferably filled under the die capacitor 44 to reinforce the die capacitor when the wire 45a is bonded thereto.

Figure 7:
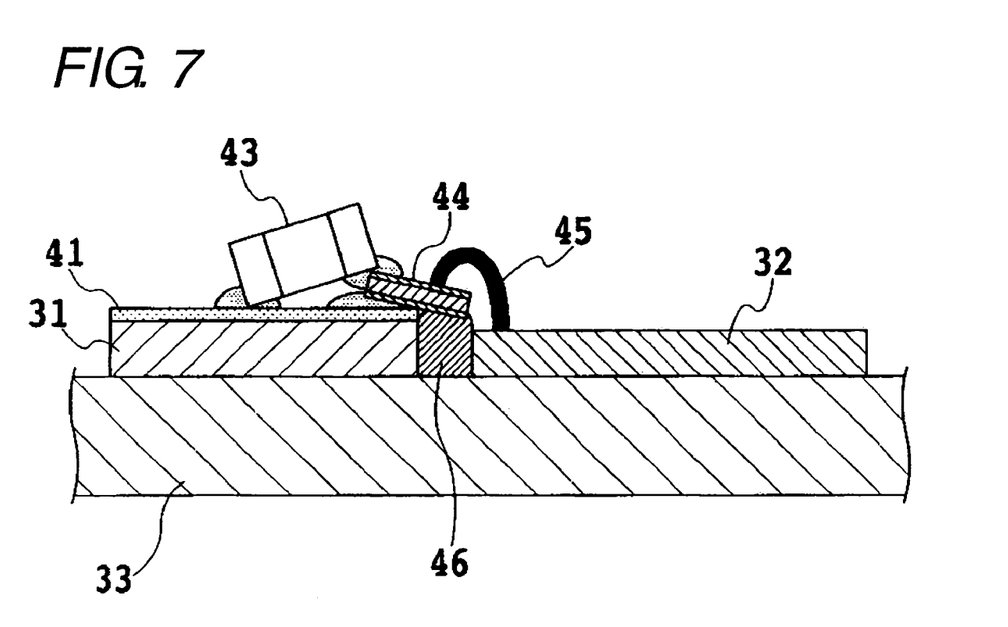
FIG. 7 is an arrangement showing the fourth embodiment of the present invention.

FIG. 7 shows a third example of the present invention. The third coupling circuit comprises a ceramic substrate 31 and a bare chip IC 32 both enclosed in a metal package 33. FIG. 7 shows only the bottom plate of the metal package 33. The die capacitor 44 is assembled at the edge of the co-planar line 41, and the other electrode of the die capacitor 44 is bonded to the IC 32 with a bonding wire 45. Similar to the previous example, the chip capacitor 43 is assembled such that one electrode thereof is directly connected to the co-planar line 41 and the other electrode is directly soldered to the upper electrode of the die capacitor 44, thus the co-planar line and two capacitors constitute the coupling circuit.

According to FIG. 7, the die capacitor 44 is mounted such that the edge thereof is sticking out from the edge of the co-planar line 41 with the insulated resin inserted between the substrate 31 and the bare chip IC 32, and is tilting toward the IC 32. When the level of the upper surface of the IC 32 and that of the substrate 31 is different, the arrangement shown in FIG. 7 enables to place the IC 32 close enough to the substrate 31.

Figure 8:
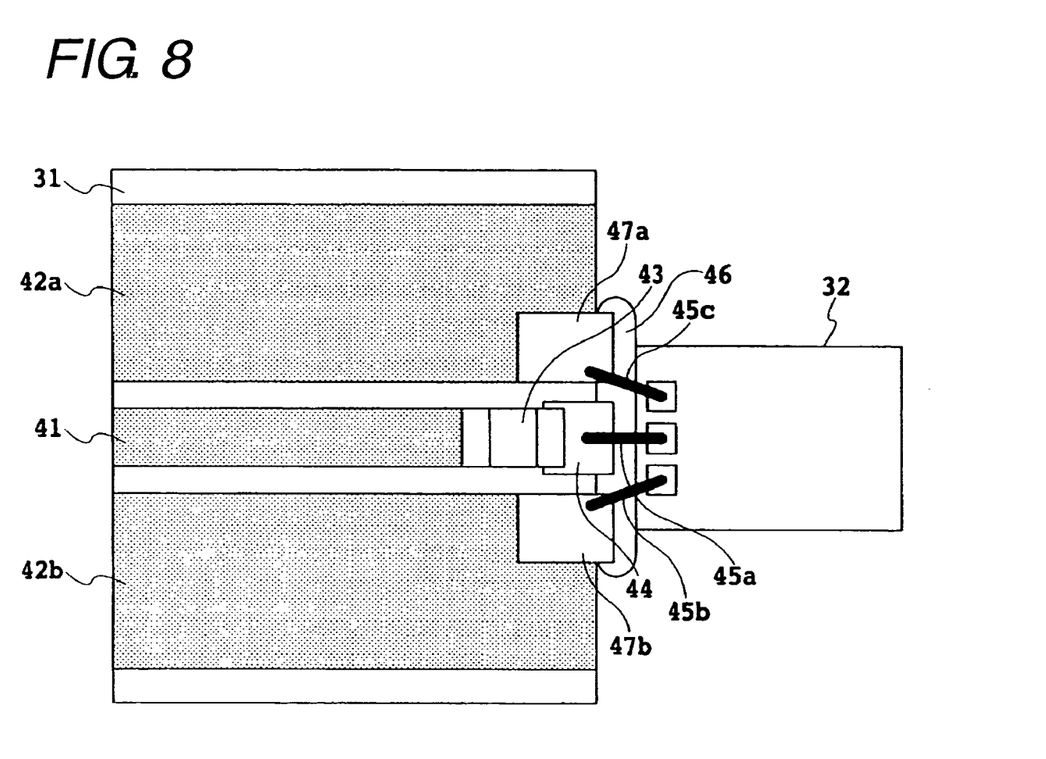
FIG. 8 is an arrangement showing the fifth embodiment of the present invention.

FIG. 8 is a plan view showing a fourth embodiment of the present invention. The coupling circuit shown in FIG. 8 comprises a ceramic substrate 31 and the bare chip IC 32. On the ceramic substrate 31, a co-planar line, which has a signal line 41 and a pair of ground patterns 42a and 42b sandwiching the signal line therebetween, is formed. The die capacitor 44 is arranged at the edge of the signal line with one electrode thereof facing to the signal line 41, while the other terminal of the die capacitor 44 is wire-bonded to the bare chip IC 32. The edge of the die capacitor 44 is sticking out from the edge of the substrate 31 toward the IC 32. The chip-capacitor 43 is assembled such that the one electrode thereof directly soldered to the signal line 41 and the other electrode is soldered to the upper electrode of the die capacitor 44. Thus, two capacitors 43 and 44, and the co-planar line 41 constitute a coupling circuit.

As described with referring to FIG. 2, discontinuity points in mechanical and electrical along the signal transmission line may cause the impedance mismatching. To reduce this impedance mismatching, the embodiment shown in FIG. 8 provide a pair of metal block 47a and 47b, each mounted on the edge of the ground pattern 42a and 42b. The transmission characteristic of the co-planar line 41, such as transmission impedance, is determined by a thickness and the dielectric constant of the substrate 31, thickness of the signal line 41 and the ground patters 42a and 42b, these types of metal, and the gaps between the signal line 41 and the ground patterns 42a and 42b. The arrangement shown in FIG. 9 enables to adjust the gaps at the edge of the signal line, the impedance mismatching is further improved.

Figure 9A:
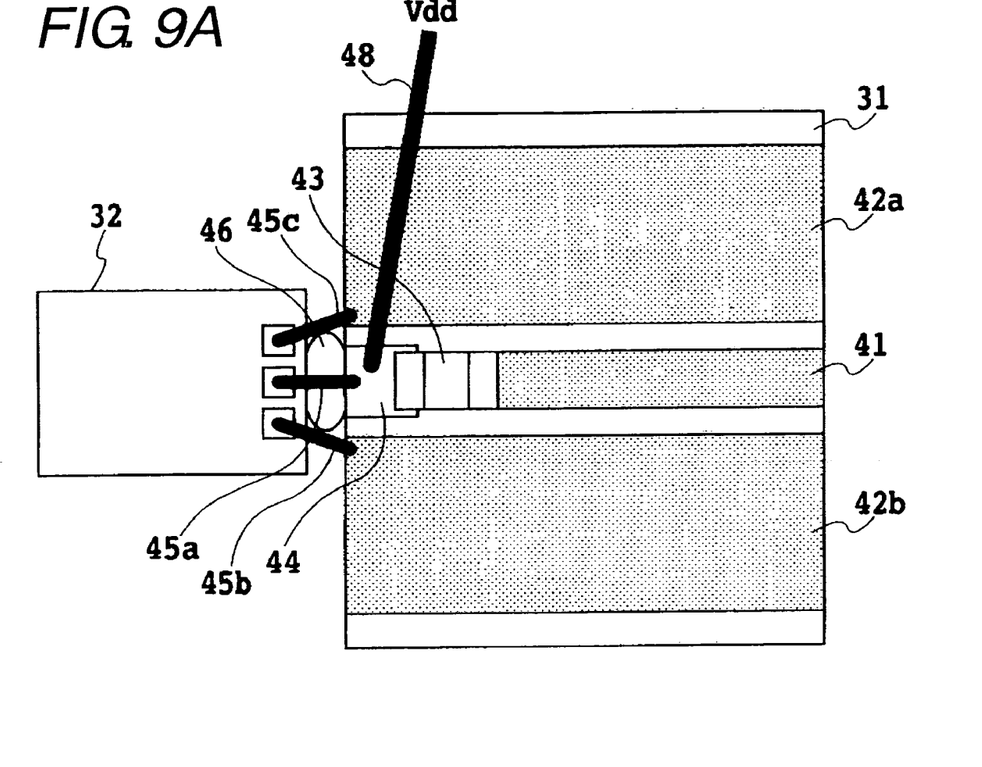
FIG. 9A is a plan view showing a sixth embodiment of the present invention.
Figure 9B:
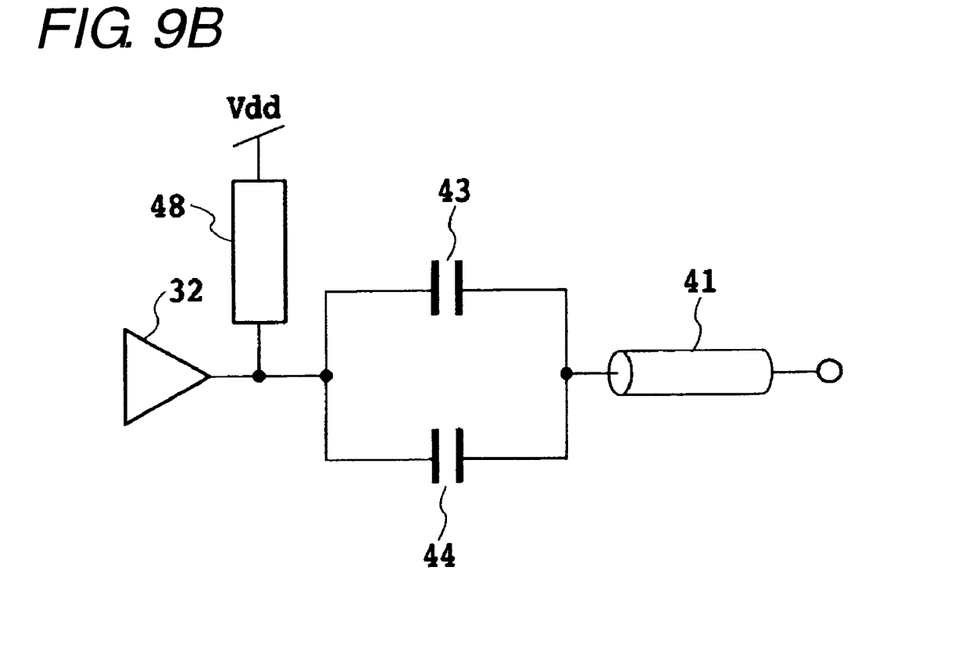
FIG. 9B is a circuit diagram of the sixth embodiment.

FIG. 9 is a fifth embodiment of the present invention. FIG. 9A is a plan view of the coupling circuit that comprises a ceramic substrate 31 and a bare chip IC 32 enclosed in a metal package. FIG. 9B is an equivalent circuit diagram of the coupling circuit shown in FIG. 9A. A co-planar line having a signal line 41 and a pair of ground patterns 42a and 42b sandwiching the signal line 41 with a predetermined gap are formed on the substrate 31. On the edge of the signal line 41, a die capacitor 44 is assembled such that one electrode thereof is facing to the signal line 41. Another electrode of the die capacitor 44 is wire-bonded to the bare chip IC 32. The edge of the die capacitor 44 is sticking out from the edge of the substrate 31. The chip capacitor 43 is assembled such that the one electrode thereof is connected to the signal line 41, while the other electrode thereof is soldered to the upper electrode of the die capacitor 44. Thus, two capacitors 43 and 44 constitute the coupling circuit.

On the upper electrode of the die capacitor 44, an inductor 48 is connected. In FIG. 9, a relatively long and slim bonding wire 48 functions as the inductor. Another terminal of the inductor 48 is supplied a power supply to operate the IC 32 from outside of the package. Such configuration shown in FIG. 9 is called as a bias-T, which enables to provide a bias to the output terminal of the IC 32. According to the present arrangement, the bias-T may be realized with fewer points where the impedance mismatching may occur.

What is claimed is:

1. A coupling circuit for connecting a co-planar line provided on a ceramic substrate to an integrated circuit in a bare chip shape, said coupling circuit comprising:
    a die capacitor connecting said co-planar line to said integrated circuit, said die capacitor having a first electrode facing to and being in contact with said co-planar line and a second electrode wire-bonded to said integrated circuit; and
    a chip capacitor connecting said co-planar line to said integrated circuit, said chip capacitor having a first electrode in direct contact with said co-planar line and a second electrode in direct contact with said second electrode of said die capacitor,
    wherein said die capacitor is mounted in an end portion of said co-planar line such that an edge of said die capacitor sticks out from an edge of said co-planar line.

2. The coupling circuit according to claim 1, wherein said substrate is enclosed in a metal package with said integrated circuit.

3. The coupling circuit according to claim 1, further includes an insulating resin filled under said die capacitor.

4. The coupling circuit according to claim 1,
    wherein said die-capacitor is tilting toward said integrated circuit.

5. The coupling circuit according to claim 1, further including an inductor connected to said second electrode of said die capacitor,
    wherein said coupling circuit and said inductor comprises a bias-T circuit.

6. The coupling circuit according to claim 4, further including an insulating resin filled under said die capacitor.

* * * * *